(12) United States Patent
Ye (10) Patent No.: US 10,514,791 B2
(45) Date of Patent: Dec. 24, 2019

(54) IN-CELL OLED TOUCH DISPLAY DEVICE

(71) Applicant: Wuhan China Star Optoelectronics Semiconductor Display Technology Co., Ltd., Wuhan, Hubei (CN)

(72) Inventor: Jian Ye, Guangdong (CN)

(73) Assignee: Wuhan China Star Optoelectronics Semiconductor Display Technology Co., Ltd., Wuhan, Hubei (CN)

( * ) Notice: Subject to any disclaimer, the term of this patent is extended or adjusted under 35 U.S.C. 154(b) by 9 days.

(21) Appl. No.: 15/576,984

(22) PCT Filed: Jul. 21, 2017

(86) PCT No.: PCT/CN2017/093835
§ 371 (c)(1),
(2) Date: Nov. 27, 2017

(87) PCT Pub. No.: WO2019/000520
PCT Pub. Date: Jan. 3, 2019

(65) Prior Publication Data
US 2019/0012022 A1   Jan. 10, 2019

(30) Foreign Application Priority Data
Jun. 28, 2017 (CN) .......................... 2017 1 0508748

(51) Int. Cl.
| G09G 1/00 | (2006.01) |
| G06F 3/041 | (2006.01) |
| H01L 27/32 | (2006.01) |
| G06F 3/044 | (2006.01) |
| H01L 51/56 | (2006.01) |

(52) U.S. Cl.
CPC ............ *G06F 3/0412* (2013.01); *G06F 3/044* (2013.01); *H01L 27/323* (2013.01); *H01L 27/3246* (2013.01); *H01L 27/3258* (2013.01); *H01L 51/56* (2013.01); *G06F 2203/04103* (2013.01);
(Continued)

(58) Field of Classification Search
CPC .......... G06F 3/041; G06F 3/044; G06F 3/047; G09G 5/003; G09G 5/18; H01L 27/32
See application file for complete search history.

(56) References Cited

U.S. PATENT DOCUMENTS

| 2015/0242041 A1* | 8/2015 | Sugita ..................... G06F 3/044 345/174 |
| 2015/0311477 A1 | 10/2015 | Cho et al. |

(Continued)

FOREIGN PATENT DOCUMENTS

| CN | 103928492 A | 7/2014 |
| CN | 106024836 A | 10/2016 |

*Primary Examiner* — Michael A Faragalla
(74) *Attorney, Agent, or Firm* — Andrew C. Cheng (57) ABSTRACT

An in-cell OLED touch display device is disclosed. The device includes an array substrate, an organic planarization layer disposed on the array substrate, a pixel definition layer disposed on the organic planarization layer, and defining multiple pixel regions, a touch electrode layer disposed on a surface of the pixel definition layer closed to the organic planarization layer, and/or disposed on a surface of the pixel definition layer away from the organic planarization layer. The above structure can increase the lightweight of the in-cell OLED touch display device, the decrease the process difficulty and increase the quality.

18 Claims, 7 Drawing Sheets

(52) U.S. Cl.
CPC ............... *G06F 2203/04111* (2013.01); *H01L 2227/323* (2013.01)

(56) References Cited

U.S. PATENT DOCUMENTS

| | | |
|---|---|---|
| 2016/0320882 A1* | 11/2016 | Kim ........................ G06F 3/044 |
| 2016/0322429 A1* | 11/2016 | Chen, Jr. ................. G06F 3/044 |
| 2017/0010493 A1 | 1/2017 | Yu |
| 2017/0220150 A1 | 8/2017 | Wu |
| 2017/0221971 A1 | 8/2017 | Shen et al. |
| 2018/0348926 A1 | 12/2018 | Su |

* cited by examiner

IN-CELL OLED TOUCH DISPLAY DEVICE

BACKGROUND OF THE INVENTION

1. Field of the Invention

The present invention relates to a display technology, and more particularly to an in-cell OLED touch display device.

2. Description of Related Art

Along with the development of the electronic technology, keyboards or mouse of most of electronic products such as mobile phones, digital cameras, handheld game consoles, and instrumentation equipment have been replaced by touch panels. The touch panel is formed by a touch detection part and a touch controller. The touch detection part is installed in front of the display panel for detecting a touch location of a user. After receiving touch signals corresponding to the touch location, the touch signals are sent to the touch controller. The main function of the touch controller is to receive the touch signals from the display panel, convert the touch signals into a touch coordinate, and send the touch coordinate to a central processor. Besides, the touch controller can receive a command outputted from the central processor, and executes the command.

In the current technology, in order to realize a touch function of an Organic Light-Emitting Diode (OLED) display panel, one solution is to individually manufacture the touch panel and the OLED display panel, then, through an optical transparent glue to adhere the OLED touch display panel to an upper surface of the OLED display panel in order to form a complete OLED touch display panel. However, the above structure will increase the thickness of the OLED touch display panel, and add an adhering process, which is not conducive for a lightweight of the OLED touch display panel. Another solution is to manufacture a touch unit on a thin-film packaging layer of the OLED display panel. However, the touch unit is manufactured after the thin-film packaging layer and film layers below the thin-film packaging layer, the property of the film layers will generate a larger limitation to the manufacturing process of the touch unit so as to increase the manufacturing difficulty of the touch OLED display device, and decrease the quality.

SUMMARY OF THE INVENTION

The main technology problem solved by the present invention is to provide an OLED display device in order to increase the lightweight of the in-cell OLED touch display device, the decrease the process difficulty of the in-cell OLED touch display device and increase the quality.

In order to solve the above technology problem, a technology solution adopted by the present invention is: providing an in-cell OLED touch display device, comprising: an array substrate; an organic planarization layer disposed on the array substrate; a pixel definition layer disposed on the organic planarization layer, and defining multiple pixel regions; a light-emitting layer disposed on the pixel definition layer; a touch electrode layer disposed on a surface of the pixel definition layer closed to the organic planarization layer, and/or disposed on a surface of the pixel definition layer away from the organic planarization layer; wherein, the touch electrode layer includes multiple sensing electrodes and multiple driving electrodes which are intersected and insulated; the multiple sensing electrodes and multiple driving electrodes are arranged at projection locations of gaps among the multiple pixel regions in order to reduce blocking to the multiple pixel regions.

In order to solve the above technology problem, another technology solution adopted by the present invention is: providing an in-cell OLED touch display device, comprising: an array substrate; an organic planarization layer disposed on the array substrate; a pixel definition layer disposed on the organic planarization layer, and defining multiple pixel regions; a touch electrode layer disposed on a surface of the pixel definition layer closed to the organic planarization layer, and/or disposed on a surface of the pixel definition layer away from the organic planarization layer.

In order to solve the above technology problem, another technology solution adopted by the present invention is: providing a manufacturing method for an in-cell OLED touch display device, comprising steps of: forming an array substrate having a source-drain electrode layer; forming multiple lead wires in the source-drain electrode layer; forming an organic planarization layer on the multiple lead wires and the source-drain electrode layer; forming multiple through holes in the organic planarization layer; and forming a touch electrode layer on the organic planarization layer, and making the touch electrode layer to be connected to the multiple lead wires through the multiple through holes.

The beneficial effects of the present invention is: comparing to the conventional art, the embodiment of the present invention disposes the touch electrode layer on the surface of the pixel definition layer closed to the organic planarization layer, and/or disposes on the surface of the pixel definition layer away from the organic planarization layer. Through the above way, the present invention can embed the touch electrode layer in the OLED display panel to increase the lightweight property of the in-cell OLED touch display device of the embodiment. The present invention can also improve the limitation of a material property of a film disposed on the pixel definition layer to the touch electrode layer in order to decrease the process difficulty of the in-cell OLED touch display device so as to increase the quality.

DETAILED DESCRIPTION OF THE PREFERRED EMBODIMENT

Figure 1:
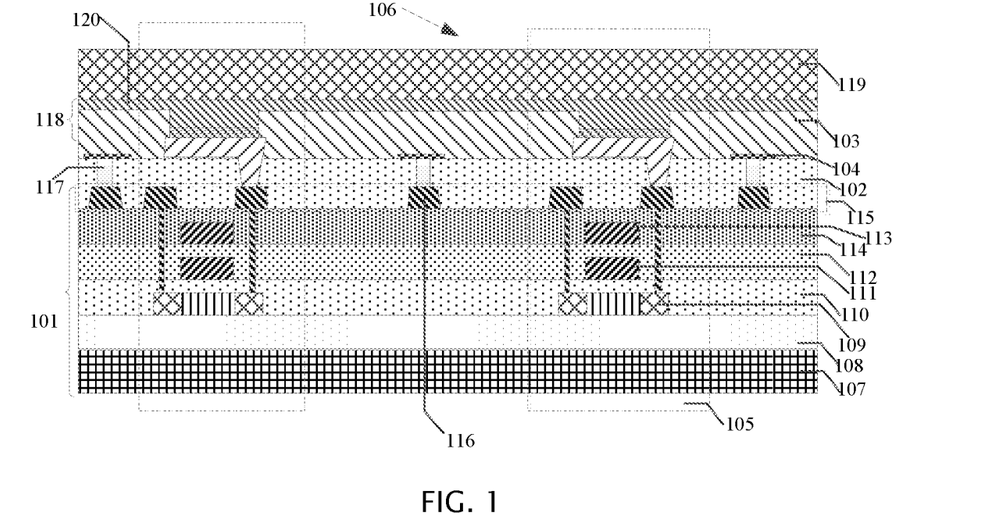
FIG. 1 is a schematic diagram of an in-cell OLED touch display device according to a first embodiment of the present invention.
Figure 2A:
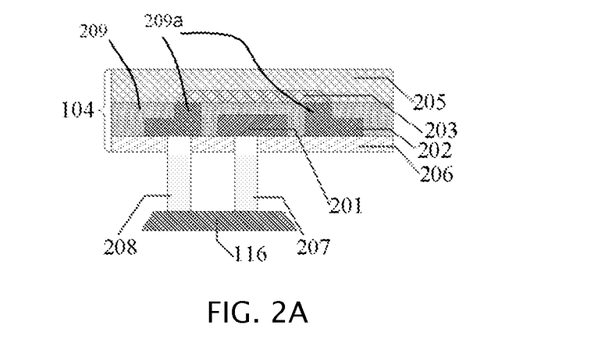
FIG. 2A is a schematic diagram of a portion of a touch electrode layer in FIG. 1.
Figure 2B:
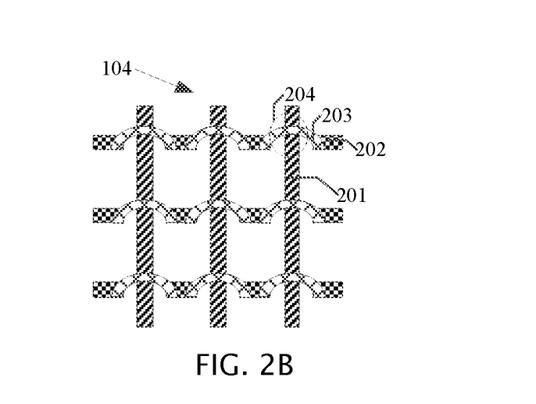
FIG. 2B is a schematic diagram of entire structure of a touch electrode in FIG. 1.

With reference to FIG. 1, FIG. 2A and FIG. 2B, wherein, FIG. 1 is a schematic diagram of an in-cell OLED touch display device according to a first embodiment of the present invention; FIG. 2A is a schematic diagram of a portion of a touch electrode layer in FIG. 1; and FIG. 2B is a schematic diagram of entire structure of a touch electrode in FIG. 1. The present embodiment includes: an array substrate 101, an organic planarization layer 102, a pixel definition layer 103 and a touch electrode layer 104. Wherein, the organic planarization layer 102 is disposed on the array substrate 101; the pixel definition layer 103 is disposed on the organic planarization layer 102, and the pixel definition layer 103 defines multiple pixel regions 105; the touch electrode layer 104 is disposed on a surface of the pixel definition layer 103 closed to the organic planarization layer 102, and used for detecting a touch operation of the in-cell OLED touch display panel 106 of the present embodiment.

The touch electrode layer 104 is disposed on the surface of the pixel definition layer 103 closed to the organic planarization layer 102. It can be understood that the touch electrode layer 104 is completely embedded into, partially embedded into or completely not embedded into the surface of the organic planarization layer 102.

Comparing to the conventional art, the embodiment of the present invention disposes the touch electrode layer 104 on the surface of the pixel definition layer 103 closed to the organic planarization layer 102 so that the present invention can embed the touch electrode layer 104 in the OLED display panel to increase the lightweight property of the in-cell OLED touch display device of the embodiment. The present invention can also improve the limitation of a material property of a film disposed on the pixel definition layer 103 to the touch electrode layer 104 in order to decrease the process difficulty of the in-cell OLED touch display device 106 so as to increase the quality.

Wherein, the array substrate 101 of the present embodiment specifically includes a guiding film 107, a buffering layer 108, a source-drain region layer 109, a first gate insulation layer 110, a first gate electrode 111, a second gate insulation layer 112, a second gate electrode 113, an intermediate layer 114 and a source-drain electrode layer 115. The above structures are common elements of the array substrate, no more repeating. Of course, in another embodiment, another substrate having other elements can replace the array substrate 101.

Optionally, the source-drain electrode layer 115 of the array substrate 101 of the present embodiment further includes multiple lead wires 116. The multiple lead wires 116 are disposed at the same layer as the source-drain electrode layer 115, and the organic planarization layer 102 on the array substrate 101 is provides with multiple through holes 117 such that the touch electrode layer 104 is connected with the multiple lead wires 116 through the multiple through holes 117. Accordingly, traces of the touch electrode layer 104 can be disposed at the source-drain electrode layer 115 so that the lead wires 116 of touch electrode layer 104 and lead wires of source and drain electrodes of the source-drain electrode layer 115 are led out at the same layer, and the above lead wires can commonly use a same circuit board bonding region. Through the bonding region, electric signals of the touch electrode layer 104 and electric signals of the source-drain electrode layer 115 can be sent to a driving circuit in order to realize an integration of touch and display. The above structure can reduce a thickness of the in-cell OLED touch display panel 106, simplify the production process and save the production cost.

Optionally, the touch electrode layer 104 of the present embodiment includes multiple sensing electrodes 201 and multiple driving electrodes 202 which are intersected and insulated (as shown in FIG. 2A). Besides, the multiple sensing electrodes 201 and multiple driving electrodes 202 are arranged at projection locations of gaps among the multiple pixel regions 105 in order to reduce the blocking to the pixel regions 105.

Optionally, in order to increase the conductivity and flexibility of the touch electrode layer 104, each of the multiple sensing electrodes 201 and multiple driving electrodes 202 are made of anyone of metal materials of Ag, Ti, Al and Mo or an alloy material selected from Ag, Ti, Al and Mo. Of course, in another embodiment, other metal materials or other alloy materials or other nonmetallic materials can be adopted.

Figure 3:
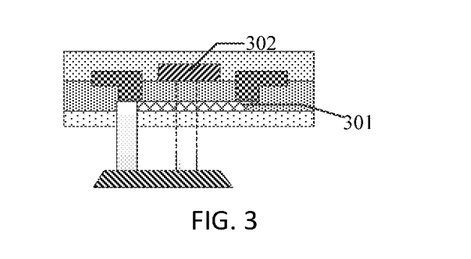
FIG. 3 is schematic diagram of another portion of a touch electrode layer in FIG. 1.

Optionally, the multiple sensing electrodes 201 and multiple driving electrodes 202 are disposed at the same layer, and all disposed on the surface of the pixel definition layer 103 closed to the organic planarization layer 102. In order to ensure that the multiple sensing electrodes 201 and multiple driving electrodes 202 are insulated with each other, each driving electrode 202 is divided into multiple sections, and multiple conductive bridges 203 are provided (as shown in FIG. 2B) such that the conductive bridges 203 are located above the sensing electrodes 201, and the conductive bridges 203 connects the driving electrodes 202 at two sides of the intersection location 204 of the sensing electrodes 201 and the driving electrodes 202. The above method can make the multiple sensing electrodes 201 and the multiple driving electrodes 202 which are disposed at a same layer to be insulated with each other. Of course, in another embodiment, each sensing electrode 201 can also be divided into multiple sections, and multiple conductive bridges 203 are provided to connect the sensing electrodes 201 disposed at two sides of the intersection locations 204 of the sensing electrodes 201 and the driving electrodes 202 in order to achieve the above technology effect. Of course, in another embodiment, the conductive bridges 301 are disposed below the sensing electrodes 302 (as shown in FIG. 3). In one embodiment, as shown in FIGS. 2A-2B, the multiple driving electrodes 202 are parallel to each other and extend along a first direction, the multiple sensing electrodes 201 are parallel to each other and extend along a second direction perpendicular with the first direction; each of the multiple driving electrodes 202 is divided into multiple sections at intersection locations 204 of the multiple driving electrodes 202 and the multiple sensing electrodes 201. The touch electrode layer 104 further comprises a supporting layer 209 covering the multiple driving electrodes 202 and the multiple sensing electrodes 201. The multiple conductive bridges 203 are located on a surface of the supporting layer 209 away from the multiple driving electrodes 202 and the multiple sensing electrodes 201, and at intersection locations 204 of the multiple driving electrodes 202 and the multiple sensing electrodes 202. The supporting layer 209 defines multiple through apertures 209a, and the multiple conductive bridges 203 are connected to the multiple sections through the multiple through apertures 209a.

Of course, the present embodiment can also include a protection layer 205 located above the conductive bridges 203 and having a protection function, and an insulation layer 206 disposed below the sensing electrodes 201 and the driving electrodes 202. For the structure of the embodiment shown in FIG. 3, a similar extending structure can be adopted. All the multiple driving electrodes 202, the multiple sensing electrodes 201, the multiple conductive bridges 203, and the supporting layer 209 are sandwiched between the protection layer 205 and the insulation layer 206.

Optionally, the through hole 117 of the present embodiment includes multiple first through holes 207 and multiple second through holes 208. The multiple first through holes 207 and the multiple second through holes 208 both pass through the organic planarization layer 102 to the source-drain electrode layer 115 (as shown in FIG. 1) such that the multiple sensing electrodes 201 are connected to corresponding lead wires 116 through the multiple first through holes 207, the multiple driving electrodes 202 are connected to the corresponding lead wires 116 through the multiple second through holes 208.

Optionally, the present embodiment further includes other structures that form the in-cell OLED touch display panel 106 such as a light-emitting layer 118 disposed on the pixel definition layer 103, a thin-film packaging layer 119 disposed on the light-emitting layer 118. As discussed above, the touch electrode layer 104 is disposed below the light-emitting layer 118. That is, in the manufacturing process of the in-cell OLED touch display panel 106, the touch electrode layer 104 is formed first, and then, the light-emitting layer 118 is formed. Accordingly, the low resistance for high temperature property of the organic material of the light emitting layer 118 in the manufacturing process of the touch electrode layer 104 can be improved in order to decrease the process difficulty of the in-cell OLED touch display device 106 to improve the quality.

Optionally, the light-emitting layer 118 of the present embodiment includes a cathode layer 120. Multiple touch capacitors (not shown) are formed between the multiple sensing electrodes 201 and the multiple driving electrodes 202 and the cathode electrode layer 120.

Figure 4A:
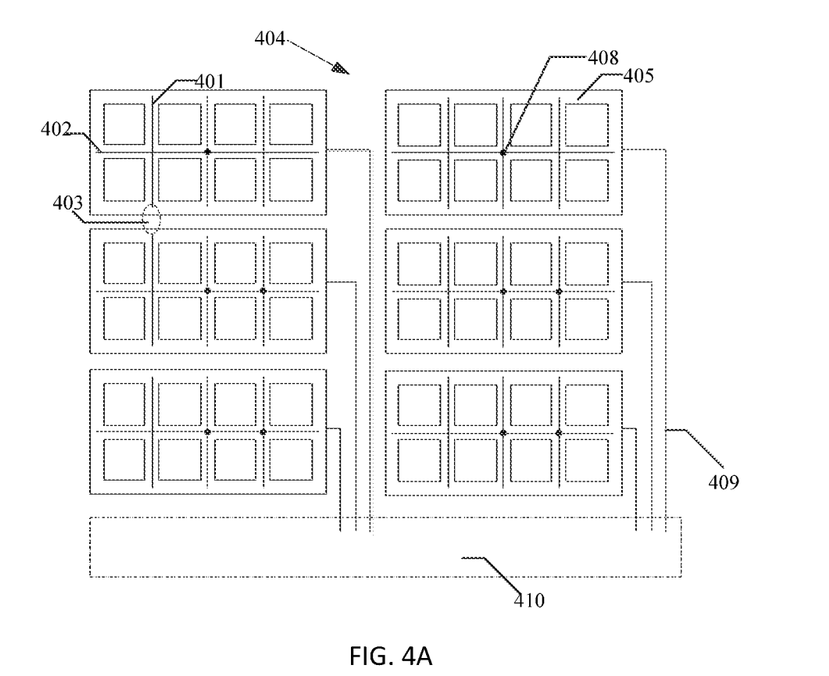
FIG. 4A is a schematic diagram of an in-cell OLED touch display device according to a second embodiment of the present invention.
Figure 4B:
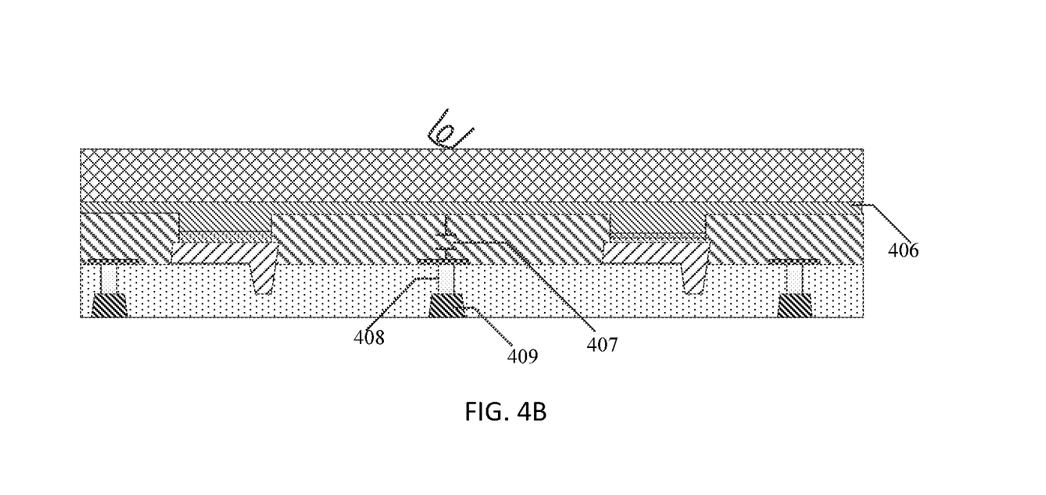
FIG. 4B is a schematic diagram of a portion of structure of the embodiment in FIG. 4A.

Specifically, with reference to FIG. 4A and FIG. 4B together, wherein, FIG. 4A is a schematic diagram of an in-cell OLED touch display device according to a second embodiment of the present invention, and FIG. 4B is a schematic diagram of a portion of structure of the embodiment in FIG. 4A. In the present embodiment, breaking points 403 are provided corresponding to multiple sensing electrodes 401 and multiple driving electrodes 402 in order to divide the entire touch electrode layer 404 into multiple independent touch electrode units 405. A capacitor 407 is formed between each touch electrode unit 405 and a cathode layer 406 (as shown in FIG. 4B). each independent touch electrode unit 405 is connected to the lead wire 409 of the source-drain electrode layer through the through hole 408, and the lead wires 409 is extended to a bonding region 410. When touching the panel of the in-cell OLED touch display device, a capacitance value of the capacitor 407 will change. Through the lead wire 409, the change of the capacitance value can be detected, a touch position can be obtained and a corresponding operation can be executed. In the present embodiment, the number of the through holes 408 in each touch electrode unit 405 is not specifically limited, and can be one, two or more.

Figure 5:
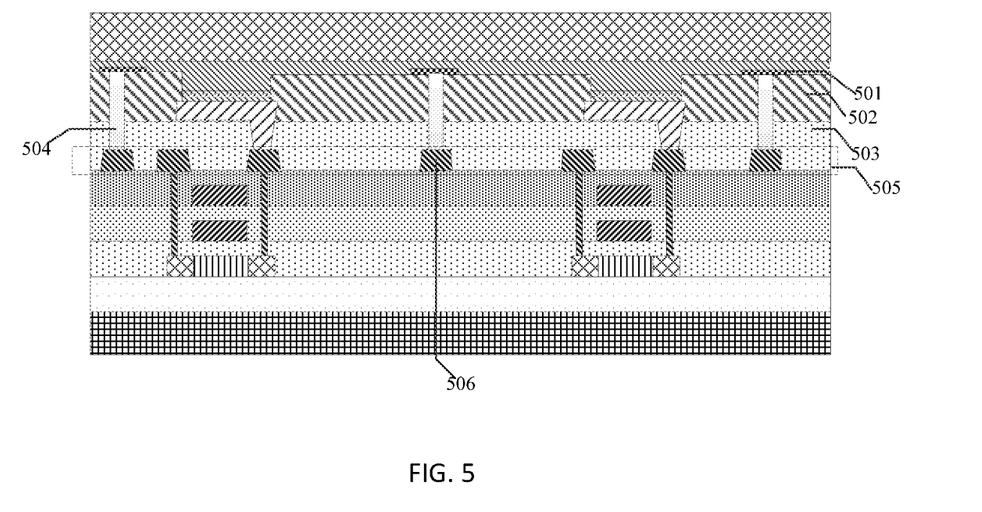
FIG. 5 is a schematic diagram of an in-cell OLED touch display device according to a third embodiment of the present invention.

With reference to FIG. 5, FIG. 5 is a schematic diagram of an in-cell OLED touch display device according to a third embodiment of the present invention. The difference between the present embodiment and the embodiment shown in FIG. 1 is that the touch electrode layer 501 is disposed on a surface of the pixel definition layer 502 away from the planarization organic layer 503. Correspondingly, multiple sensing electrodes and multiple driving electrodes of the touch electrode layer 501 are disposed on a surface of the pixel definition layer 502 away from the organic planarization layer 503. Multiple through holes 504 of the present embodiment all pass through the pixel definition layer 502 and the organic planarization layer 503 to the source-drain electrode layer 505 such that the multiple sensing electrodes and the multiple driving electrodes of the touch electrode layer 501 pass through the multiple through holes 504 to connect corresponding lead wires 506. Other specific structures and extension of the present embodiment are the same as the embodiment shown in FIG. 1, no more repeating.

Figure 6A:
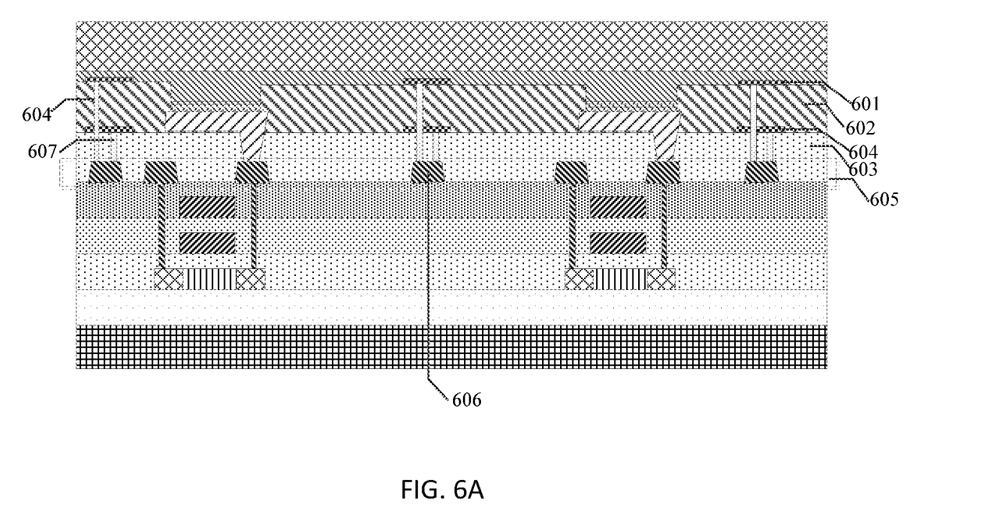
FIG. 6A is a schematic diagram of an in-cell OLED touch display device according to a fourth embodiment of the present invention.
Figure 6B:
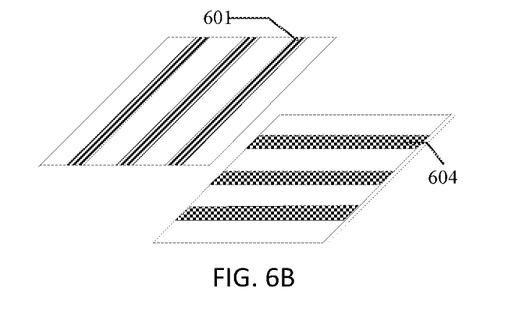
FIG. 6B is a schematic diagram of a structure of a sensing electrode and a driving electrode of the embodiment shown in FIG. 6A.

With reference to FIG. 6A and FIG. 6B together, FIG. 6A is a schematic diagram of an in-cell OLED touch display device according to a fourth embodiment of the present invention. FIG. 6B is a schematic diagram of a structure of a sensing electrode and a driving electrode of the embodiment shown in FIG. 6A. The difference between the present embodiment and the embodiment shown in FIG. 1 is that multiple sensing electrodes 601 and multiple driving electrodes 604 are not disposed at a same layer. Specifically, the multiple sensing electrodes 601 are all disposed on a surface of the pixel definition layer 602 away from the organic planarization layer 603, and the multiple driving electrodes 604 are all disposed on a surface of the organic planarization layer 603 closed to the organic planarization layer 603. The multiple sensing electrodes 601 and multiple driving electrodes 604 are insulated through the pixel definition layer 602. Multiple first through holes 604 all pass through the pixel definition layer 602 and the organic planarization layer 603 to the source-drain electrode layer 605 such that the multiple sensing electrodes 601 are connected to the lead wires 606 through the multiple first through holes 604. Multiple second through holes 607 all pass through the organic planarization layer 603 to the source-drain electrode layer 605 such that the multiple driving electrodes 604 are connected to the source-drain electrode layer 605 through the multiple second through holes 607. Other specific structures and extension of the structures are the same as the embodiment shown in FIG. 1, no more repeating.

Figure 7:
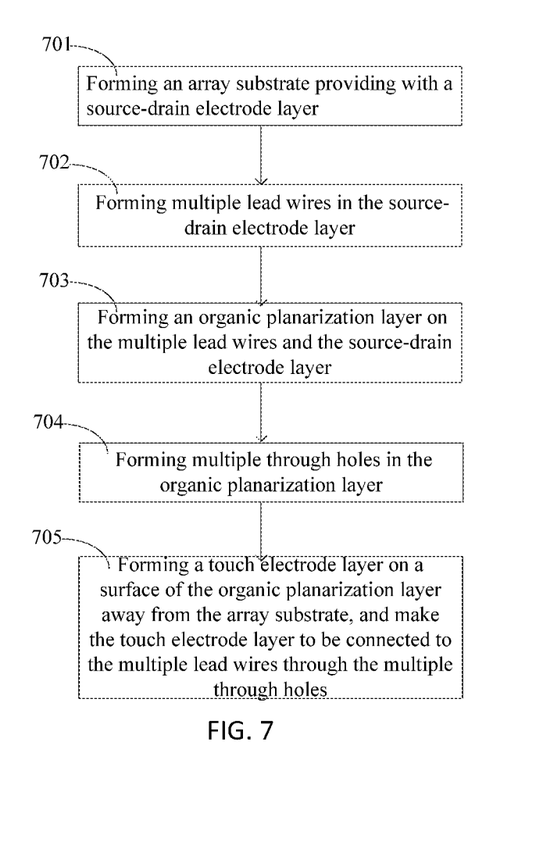
FIG. 7 is a schematic diagram of a manufacturing method for an in-cell OLED touch display device according to a first embodiment of the present invention.
Figure 8:
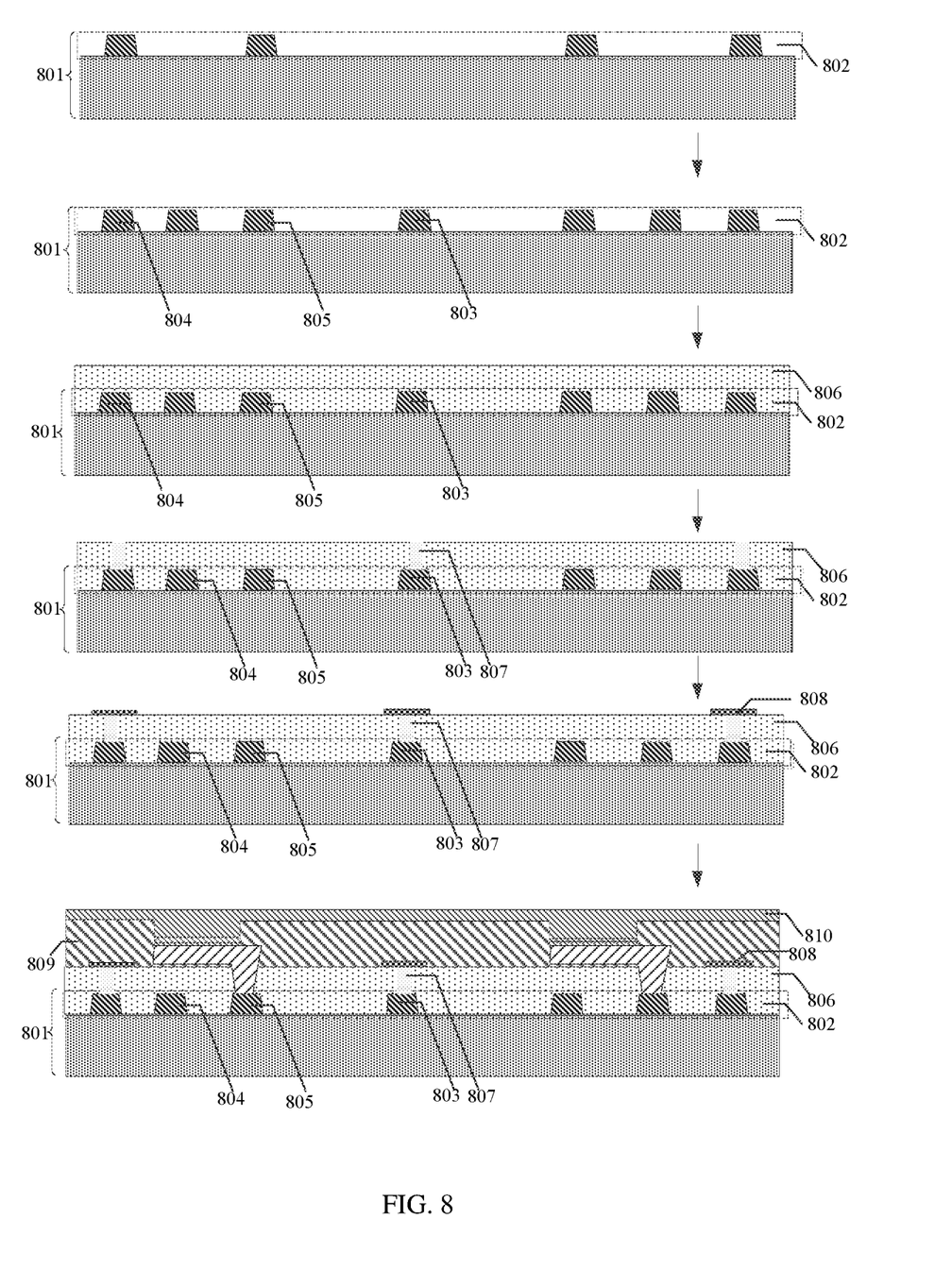
FIG. 8 is a schematic diagram of structures of embodiment in FIG. 7.

With reference to FIG. 7 and FIG. 8 together, FIG. 7 is a schematic diagram of a manufacturing method for an in-cell OLED touch display device according to a first embodiment of the present invention, and FIG. 8 is a schematic diagram of structures of embodiment in FIG. 7. The present embodiment is used for manufacturing the in-cell touch OLED display device in the embodiment of FIG. 1. The present embodiment specifically includes following steps:

Step 701: forming an array substrate 801, wherein, the array substrate 801 is provided with a source-drain electrode layer 802. The structure of the array substrate 801 has been introduced at the above embodiment, and the manufacturing method of the array substrate 801 can adopt the conventional technology, no more repeating here.

Step 702: forming multiple lead wires 803 in the source-drain electrode layer 802.

Specifically, a source electrode 804 and a drain electrode 805 in the source-drain electrode layer 802 can be manufactured by a same process.

Step 703: forming an organic planarization layer 806 on the multiple lead wires 803 and the source-drain electrode layer 802.

Step 704: forming multiple through holes 807 in the organic planarization layer 806.

The multiple through holes 807 can be formed by adopting but not limited to an exposure and development method.

Step 705: forming a touch electrode layer 808 on a surface of the organic planarization layer 806 away from the array substrate 801, and make the touch electrode layer 808 to be connected to the multiple lead wires 803 through the multiple through holes 807.

The touch electrode layer of the present embodiment can adopt but not limited to a mask having a preset pattern, and through a dry etching method.

Comparing to the conventional art, the embodiment of the present invention can embed the touch electrode layer 808 in the OLED display panel to increase the lightweight property of the in-cell OLED touch display device of the embodiment. The present invention can also improve the limitation of a material property of a film disposed on the organic planarization layer 806 to the touch electrode layer 808 in order to decrease the process difficulty of the in-cell OLED touch display device so as to increase the quality.

Optionally, after the step 705, the present embodiment further includes a step of sequentially forming a pixel definition layer 809 and a light-emitting layer 810 on the organic planarization layer 806 and the touch electrode layer 808 in order to improve the limitation of the low resistance for high temperature property of the organic material of the light emitting layer 810 to the touch electrode layer 808 in the manufacturing process of the touch electrode layer 808.

Figure 9:
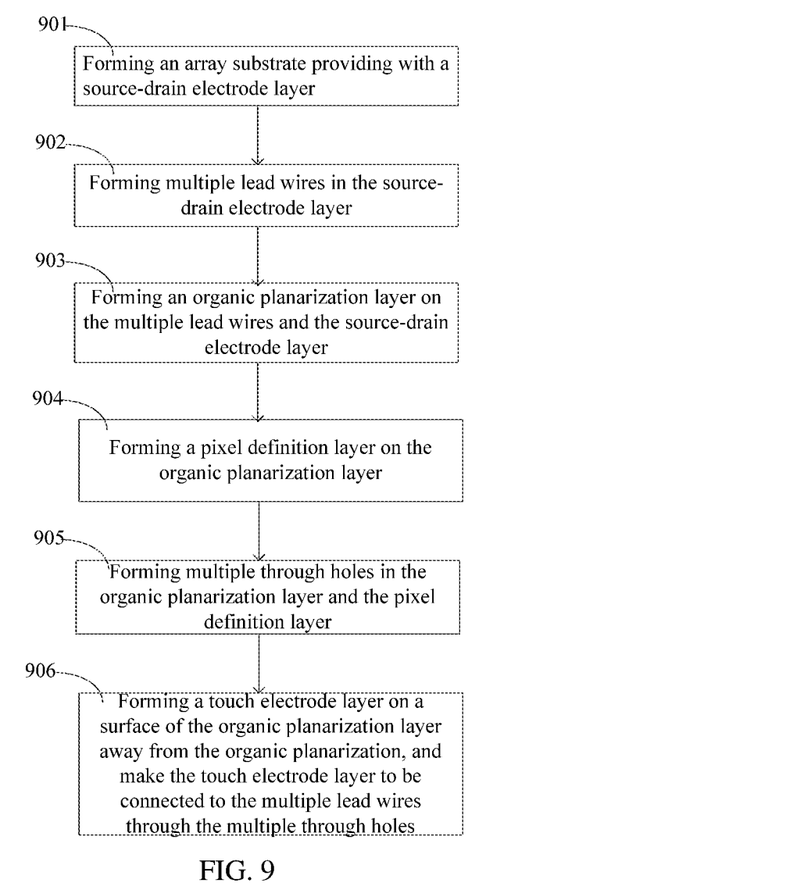
FIG. 9 is a schematic diagram of a manufacturing method for an in-cell OLED touch display device according to a second embodiment of the present invention.

With reference to FIG. 9, and FIG. 9 is a schematic diagram of a manufacturing method for an in-cell OLED touch display device according to a second embodiment of the present invention. The present embodiment includes step 901 to step 906. The present embodiment is used for manufacturing the in-cell OLED touch display device in FIG. 5. The difference between the present embodiment and the embodiment in FIG. 7 is that forming a pixel definition layer on the organic planarization layer firstly, then, forming a touch electrode layer on the pixel definition layer such that the touch electrode layer is disposed on a surface of the pixel definition layer away from the organic planarization layer, and the through holes pass through the pixel definition layer and the organic planarization layer. Other steps of the present embodiment are the same as the embodiment shown in FIG. 7, no more repeating.

Figure 10:
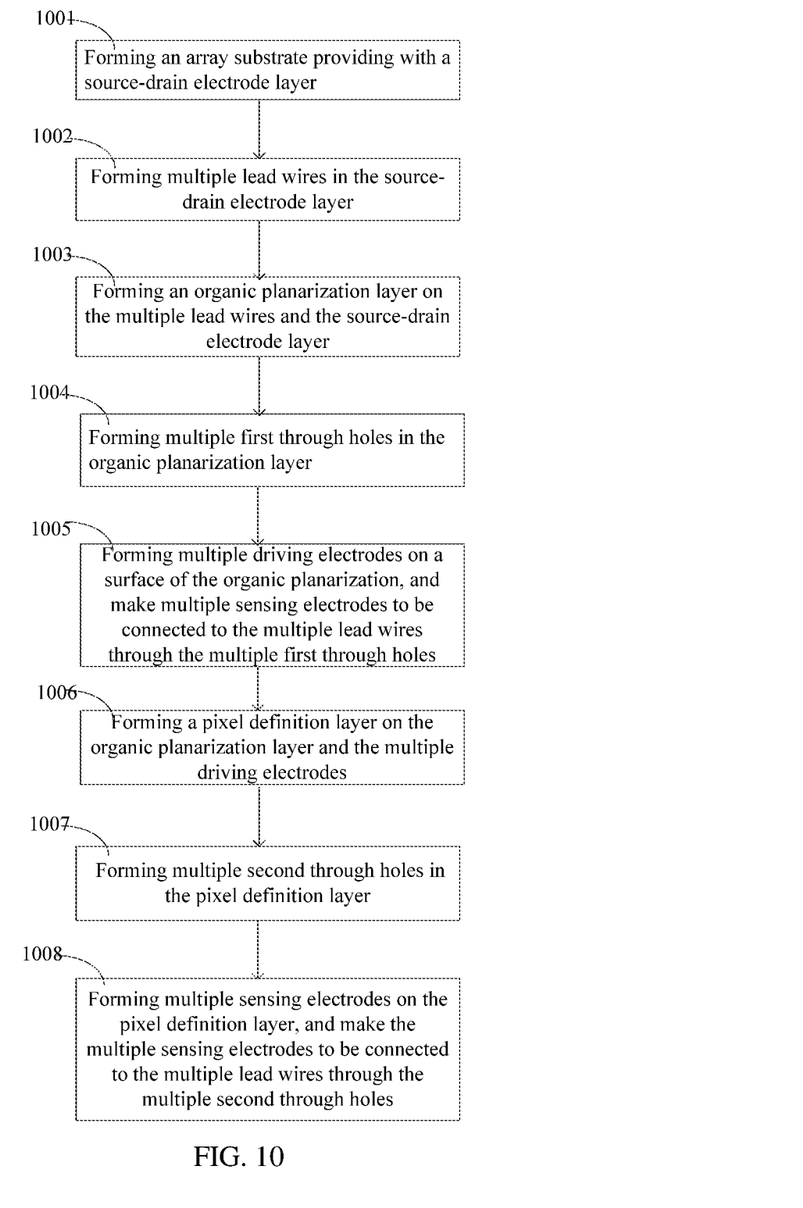
FIG. 10 is a schematic diagram of a manufacturing method for an in-cell OLED touch display device according to a third embodiment of the present invention.

With reference to FIG. 10, and FIG. 10 is a schematic diagram of a manufacturing method for an in-cell OLED touch display device according to a third embodiment of the present invention. The present embodiment is used for manufacturing the in-cell OLED touch display device in FIG. 6. The present embodiment includes step 1001 to step 1008. The difference between the present embodiment and the embodiment in FIG. 7 is that forming driving electrodes of the touch electrode layer on the organic planarization layer firstly, then, forming a pixel definition layer on the organic planarization layer and the driving electrodes. Finally, forming sensing electrodes of the touch electrode layer on the pixel definition layer such that the multiple sensing electrodes and the multiple driving electrodes are respectively disposed on the surface of the pixel definition layer closed to the organic planarization layer and on the surface of the pixel definition layer away from the organic planarization layer. Besides, the first through hole that connects the driving electrode pass through the organic planarization layer, and the second through hole that connects the sensing electrode pass through the pixel definition layer and the organic planarization layer. Other steps of the present embodiment are the same as the embodiment shown in FIG. 7, no more repeating.

Comparing to the conventional art, the embodiment of the present invention can embed the touch electrode layer in the OLED display panel to increase the lightweight property of the in-cell OLED touch display device of the embodiment. The present invention can also improve the limitation of a material property of a film disposed on the organic planarization layer to the touch electrode layer in order to decrease the process difficulty of the in-cell OLED touch display device so as to increase the quality.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. An in-cell OLED touch display device, comprising
an array substrate;
an organic planarization layer disposed on the array substrate;
a pixel definition layer disposed on the organic planarization layer, and defining multiple pixel regions;
a light-emitting layer disposed on the pixel definition layer;
a touch electrode layer disposed on a surface of the pixel definition layer closed facing to the organic planarization layer;
wherein, the touch electrode layer comprises multiple sensing electrodes and multiple driving electrodes which are intersected and insulated; the multiple sensing electrodes and multiple driving electrodes are arranged at projection locations of gaps among the multiple pixel regions in order to reduce blocking to the multiple pixel regions; and both the multiple sensing electrodes and the multiple driving electrodes are disposed on the surface of the pixel definition layer facing to the organic planarization layer,
wherein the multiple driving electrodes are parallel to each other and extend along a first direction, the multiple sensing electrodes are parallel to each other and extend along a second direction intersected with the first direction; each of the multiple driving electrodes or each of the multiple sensing electrodes is divided into multiple sections; and the touch electrode layer further comprises:
a supporting layer covering the multiple driving electrodes and the multiple sensing electrodes; and
multiple conductive bridges located on a surface of the supporting layer away from the multiple driving electrodes and the multiple sensing electrodes, at intersection locations of the multiple driving electrodes and the multiple sensing electrodes, and connecting the multiple sections.

2. The display device according to claim 1, wherein,
the touch electrode layer further comprises multiple conductive bridges; the multiple conductive bridges are located above the multiple sensing electrodes or the multiple driving electrodes for connecting the multiple driving electrodes or the multiple sensing electrodes located at two sides of intersection locations of the multiple sensing electrodes and the multiple driving electrodes.

3. The display device according to claim 1, wherein, the touch electrode layer further comprises multiple conductive bridges; the multiple conductive bridges are located below the multiple sensing electrodes or the multiple driving electrodes for connecting the multiple driving electrodes or the multiple sensing electrodes located at two sides of intersection locations of the multiple sensing electrodes and the multiple driving electrodes.

4. The display device according to claim 2, wherein, the touch electrode layer further comprises a protection layer located above the conductive bridges, and an insulation layer disposed below the multiple sensing electrodes and the multiple driving electrodes.

5. An in-cell OLED touch display device, comprising
an array substrate;
an organic planarization layer disposed on the array substrate;
a pixel definition layer disposed on the organic planarization layer, and defining multiple pixel regions;
a touch electrode layer disposed on a surface of the pixel definition layer away from the organic planarization layer;
wherein, the touch electrode layer comprises multiple sensing electrodes and multiple driving electrodes which are intersected and insulated; the multiple sensing electrodes and multiple driving electrodes are arranged at projection locations of gaps among the multiple pixel regions in order to reduce blocking to the multiple pixel regions; and both the multiple sensing electrodes and the multiple driving electrodes are disposed on the surface of the pixel definition layer away from the organic planarization layer,
wherein the multiple driving electrodes are parallel to each other and extend along a first direction, the multiple sensing electrodes are parallel to each other and extend along a second direction intersected with the first direction; each of the multiple driving electrodes or each of the multiple sensing electrodes is divided into multiple sections; and the touch electrode layer further comprises:
a supporting layer covering the multiple driving electrodes and the multiple sensing electrodes; and
multiple conductive bridges located on a surface of the supporting layer away from the multiple driving electrodes and the multiple sensing electrodes, at intersection locations of the multiple driving electrodes and the multiple sensing electrodes, and connecting the multiple sections.

6. The display device according to claim 5, wherein, a light-emitting layer is further provided, and being disposed on the pixel definition layer.

7. The display device according to claim 5, wherein, the touch electrode layer further comprises multiple conductive bridges; the multiple conductive bridges are located above the multiple sensing electrodes or the multiple driving electrodes for connecting the multiple driving electrodes or the multiple sensing electrodes located at two sides of intersection locations of the multiple sensing electrodes and the multiple driving electrodes.

8. The display device according to claim 5, wherein, the touch electrode layer further comprises multiple conductive bridges; the multiple conductive bridges are located below the multiple sensing electrodes or the multiple driving electrodes for connecting the multiple driving electrodes or the multiple sensing electrodes located at two sides of intersection locations of the multiple sensing electrodes and the multiple driving electrodes.

9. The display device according to claim 5, wherein, each of the multiple sensing electrodes and multiple driving electrodes are made of anyone of metal materials of Ag, Ti, Al and Mo or an alloy material selected from Ag, Ti, Al and Mo.

10. The display device according to claim 7, wherein, the touch electrode layer further comprises a protection layer located above the conductive bridges, and an insulation layer disposed below the multiple sensing electrodes and the multiple driving electrodes.

11. A manufacturing method for an in-cell OLED touch display device, comprising
forming an array substrate having a source-drain electrode layer;
forming multiple lead wires in the source-drain electrode layer;
forming an organic planarization layer on the multiple lead wires and the source-drain electrode layer;
forming multiple through holes in the organic planarization layer;
forming a pixel definition layer on the organic planarization layer to define multiple pixel regions; and
forming a touch electrode layer on a first surface of the pixel definition layer facing to the organic planarization layer or a second surface of the pixel definition layer away from the organic planarization layer, and making the touch electrode layer to be connected to the multiple lead wires through the multiple through holes, wherein the touch electrode layer comprises multiple sensing electrodes and multiple driving electrodes which are intersected and insulated; the multiple sensing electrodes and multiple driving electrodes are arranged at projection locations of gaps among the multiple pixel regions in order to reduce blocking to the multiple pixel regions; and both the multiple sensing electrodes and the multiple driving electrodes are disposed on the same one of the first surface or the second surface, wherein the multiple driving electrodes are parallel to each other and extend along a first direction, the multiple sensing electrodes are parallel to each other and extend along a second direction intersected with the first direction; each of the multiple driving electrodes or each of the multiple sensing electrodes is divided into multiple sections; and the touch electrode layer further comprises:
a supporting layer covering the multiple driving electrodes and the multiple sensing electrodes; and
multiple conductive bridges located on a surface of the supporting layer away from the multiple driving electrodes and the multiple sensing electrodes, at intersection locations of the multiple driving electrodes and the multiple sensing electrodes, and connecting the multiple sections.

12. The manufacturing method according to claim 11, further comprising forming a light-emitting layer on the pixel definition layer after forming the touch electrode layer.

13. The display device according to claim 1, wherein, the touch electrode layer further comprises a protection layer and an insulation layer; and all the multiple driving electrodes, the multiple sensing electrodes, the multiple conductive bridges, and the supporting layer are sandwiched between the protection layer and the insulation layer.

14. The display device according to claim 1, wherein,
the supporting layer defines multiple through apertures, and the multiple conductive bridges are connected to the multiple sections through the multiple through apertures.

15. The display device according to claim 1, wherein,
the array substrate comprises a source-drain electrode layer and multiple lead wires disposed at the same layer as the source-drain electrode layer; the organic planarization layer defines multiple through holes; and the multiple driving electrodes and the multiple sensing electrodes are connected to the multiple lead wires through the multiple through holes.

16. The display device according to claim 5, wherein,
the touch electrode layer further comprises a protection layer and an insulation layer; and all the multiple driving electrodes, the multiple sensing electrodes, the multiple conductive bridges, and the supporting layer are sandwiched between the protection layer and the insulation layer.

17. The display device according to claim 5, wherein,
the supporting layer defines multiple through apertures, and the multiple conductive bridges are connected to the multiple sections through the multiple through apertures.

18. The display device according to claim 5, wherein,
the array substrate comprises a source-drain electrode layer and multiple lead wires disposed at the same layer as the source-drain electrode layer; the organic planarization layer defines multiple through holes; and the multiple driving electrodes and the multiple sensing electrodes are connected to the multiple lead wires through the multiple through holes.

* * * * *